(12) United States Patent
Hanson et al.

(10) Patent No.: US 6,625,020 B1
(45) Date of Patent: Sep. 23, 2003

(54) FAN MODULES

(75) Inventors: Jeffrey W. Hanson, Redondo Beach, CA (US); Douglas G. Gilliland, Santa Ana, CA (US); Darrell E. Falke, Fullerton, CA (US); Dennis Patrick Miller, Fullerton, CA (US)

(73) Assignee: ADC DSL Systems, Inc., Eden Prairie, MN (US)

( * ) Notice: Subject to any disclaimer, the term of this patent is extended or adjusted under 35 U.S.C. 154(b) by 0 days.

(21) Appl. No.: 10/180,902

(22) Filed: Jun. 26, 2002

(51) Int. Cl.[7] ............................................. H05K 7/20
(52) U.S. Cl. ........................ 361/695; 165/80.3; 454/184
(58) Field of Search ...................... 62/259.2; 165/80.3, 165/121–126; 361/687–697, 724–727; 454/184; 415/176–178

(56) References Cited

U.S. PATENT DOCUMENTS

| | | | | |
|---|---|---|---|---|
| 4,126,269 A | * | 11/1978 | Bruges | 361/695 |
| 5,528,454 A | * | 6/1996 | Niklos | 361/695 |
| 5,721,670 A | * | 2/1998 | Cochrane et al. | 361/695 |
| 6,317,320 B1 | * | 11/2001 | Cosley et al. | 361/685 |

* cited by examiner

Primary Examiner—Gregory Thompson
(74) Attorney, Agent, or Firm—Fogg and Associates, LLC; Laura A. Ryan; Tod A. Myrum

(57) ABSTRACT

A fan module having a frame is provided. A fan is disposed within and attached to the frame so as to align with an aperture passing through the frame. A baffle having first and second inclined surfaces in opposition is disposed within the frame. The first surface is for changing the direction of a first fluid flow from the fan, and the second surface is for changing the direction of a second fluid flow so as to direct the second fluid flow through an exit of the fan module.

33 Claims, 5 Drawing Sheets

FAN MODULES

TECHNICAL FIELD

The present invention relates generally to the field of fans and, in particular, to fan modules.

BACKGROUND

Chassis are often used to contain circuit cards, such as circuit cards of telecommunications systems. In telecommunications applications, several chassis for containing circuit cards are, for example, stacked one above the other and are secured in a rack located in a central office or other location. Many of these circuit cards dissipate heat that if not removed from the cards and subsequently from the chassis, can cause the circuit cards to fail.

Many chassis are passively cooled chassis, e.g., heat is removed from the cards and chassis by a natural convection airflow induced by a temperature difference between heated air within the chassis and cooler air outside of the chassis. In one application, outside air is drawn into the chassis through openings at the bottom of the chassis. The air flows generally vertically through the chassis and over the cards so that heat is transferred from the cards to the air, thereby heating the air. The air exits the chassis through openings in the top of the chassis. However, in some stacked arrangements, the heated air flows from the top of one chassis into a chassis above, resulting in reduced heat transfer from the cards of the chassis above. Consequently, baffles are sometimes located between successively stacked chassis for directing the airflow generally horizontally so that the heated air does not flow from one chassis into a chassis above.

The natural convection airflow through some of these passively cooled chassis does not transfer enough heat from the circuit cards and chassis. Therefore, the circuit cards can overheat and fail, As a result, fans are often located on the bottom of one or more of the chassis so as to force air vertically upward through the chassis. However, problems occur when locating fans on the bottom of a chassis located immediately above another chassis for forcing air vertically through the chassis above. For example, there is typically insufficient space between the baffle and the bottom of the chassis above the baffle for locating a fan on the bottom of the chassis. If the baffle is removed, the fan draws warm air from the chassis below and forces the warm air into the chassis above, resulting in reduced heat transfer from the cards of the chassis above.

For the reasons stated above, and for other reasons stated below that will become apparent to those skilled in the art upon reading and understanding the present specification, there is a need in the art for alternative fan arrangements.

SUMMARY

The above-mentioned problems with locating fans on the bottoms of chassis for containing electronic components and other problems are addressed by embodiments of the present invention and will be understood by reading and studying the following specification.

One embodiment of the present invention provides a fan module having a frame. A fan is disposed within and attached to the frame so as to align with an aperture passing through the frame. A baffle having first and second inclined surfaces in opposition is disposed within the frame. The first surface is for changing the direction of a first fluid flow from the fan, and the second surface is for changing the direction of a second fluid flow so as to direct the second fluid flow through an exit of the fan module.

Another embodiment provides a method for cooling electronic component containing chassis located adjacent one another. The method includes inserting a fan module between first and second chassis located adjacent one another so that a first edge of the fan module abuts the first chassis and a second edge of fan the module abuts the second chassis. The method includes drawing air into the fan module using a fan of the fan module to create a first airflow substantially perpendicular to fronts of the first and second chassis. Directing the first airflow into the first chassis using a first inclined surface of a baffle of the fan module to remove heat from the first chassis is included in the method. The method includes directing a second airflow through the second chassis toward the first chassis to remove heat from the second chassis. Directing the second airflow substantially perpendicularly so as to flow through an exit of the fan module using a second inclined surface of the baffle in opposition to the first surface to prevent the second flow from flowing into the first chassis is also included in the method.

Further embodiments of the invention include methods and apparatus of varying scope.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Embodiments of the present invention provide fan modules that are adapted to be inserted between electronic component containing chassis that in one embodiment are stacked one above the other. The fan modules include a baffle having first and second inclined surfaces in opposition. In one embodiment, a fan of the fan module draws air substantially horizontally into the fan module to create a first airflow, and the first inclined surface directs the first airflow upwardly through a chassis located above the fan module for cooling that chassis. Drawing the air substantially horizontally overcomes the problems associated with locating fans on the bottom of the upper chassis between upper and lower chassis or between the upper chassis and a baffle located between the upper and lower chassis for forcing air substantially vertically upward through the upper chassis. The second inclined surface directs a second airflow, flowing substantially vertically through a chassis located below the fan module, substantially perpendicularly so as to exit the fan module substantially horizontally. This prevents the second airflow from flowing into the upper chassis, which is undesirable because the second airflow is heated by electronic components within the lower chassis as it flows through the lower chassis.

Figure 1:
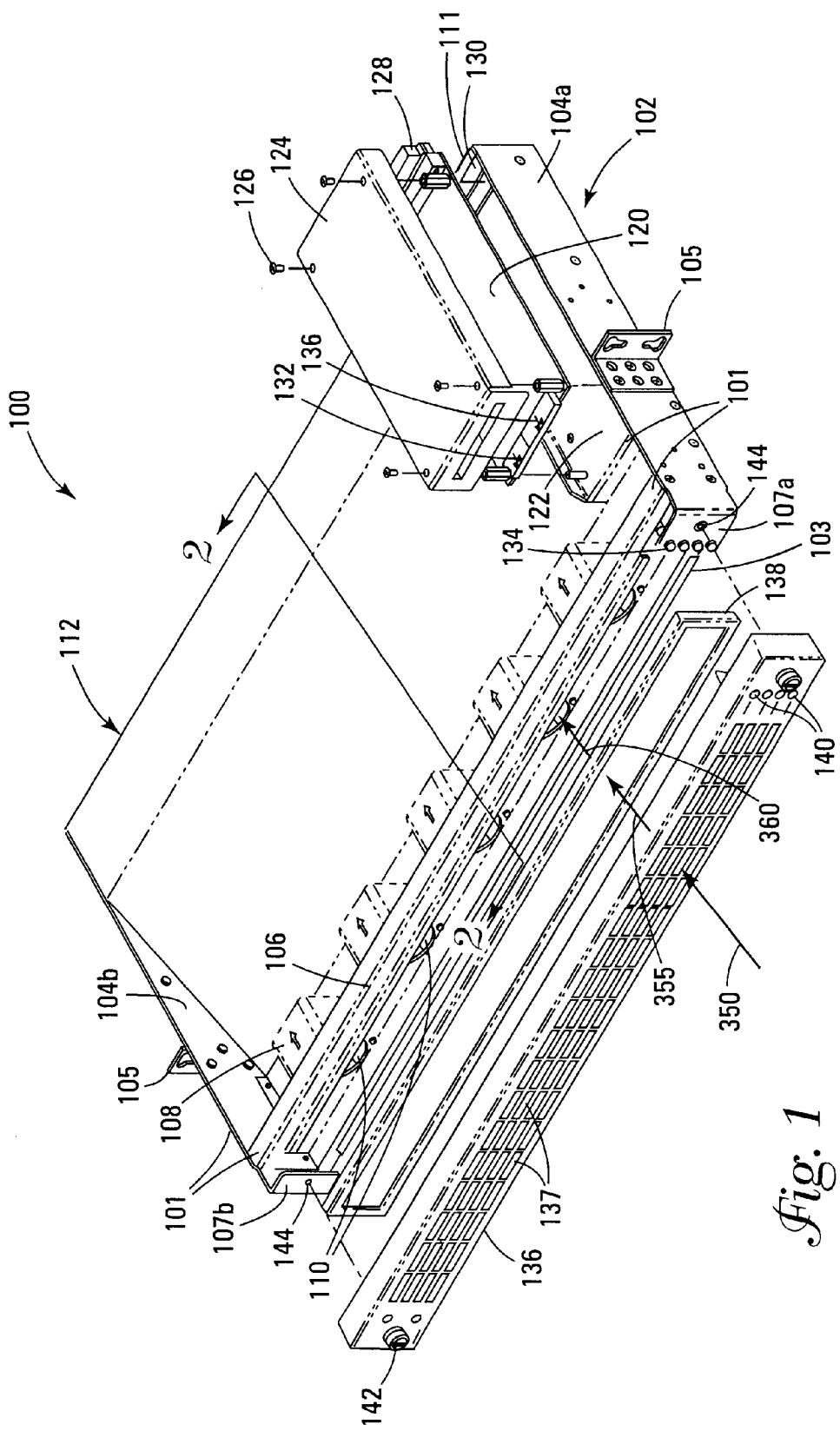
FIG. 1 is an exploded isometric view of a fan module according to an embodiment of the present invention.

FIG. 1 illustrates a fan module 100 according to an embodiment of the present invention. Fan module 100 includes a frame 102 having opposing edges 101 and 103. Frame 102 has opposing end walls 104a and 104b and a sidewall 106 connected between end walls 104a and 104b. In one embodiment, a bracket 105 is attached to each of end walls 104. In another embodiment, tabs 107a and 107b are respectively substantially perpendicularly connected to end walls 104a and 104b. In another embodiment, tabs 107a and 107b are respectively integral with end walls 104a and 104b. In yet another embodiment, a tab 111 is connected substantially perpendicularly to end wall 104a opposite to tab 107a, as shown in FIG. 1. In one embodiment, tab 111 is integral with end wall 104a.

Figure 2:
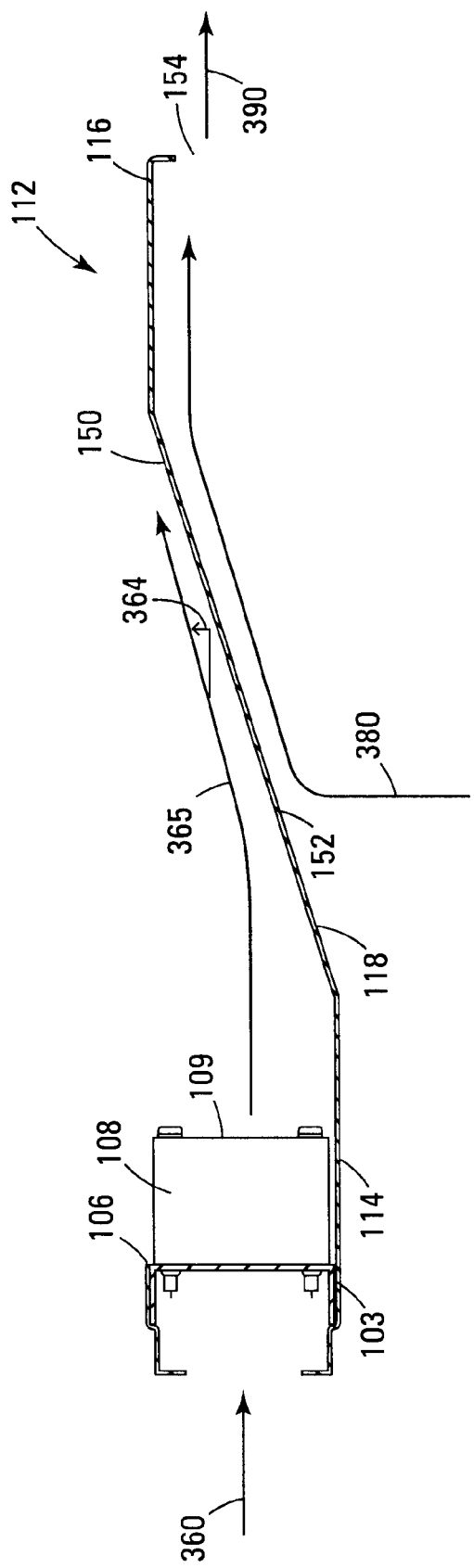
FIG. 2 is a view taken along line 2—2 of FIG. 1.

Fans 108 are disposed within frame 102 between edges 101 and 103 and are attached to sidewall 106 so as to respectively align with apertures 110 in sidewall 106. A baffle 112 is disposed within frame 102 between end walls 104a and 104b. Baffle 112 has inclined surfaces 150 and 152 in opposition, as shown in FIG. 2. Inclined surface 150 is for changing the direction of a flow from fans 108, as indicated by an arrow 365 in FIG. 2, so that the flow has a component that is perpendicular to the flow at an exit 109 of each of fans 108, as indicated by arrow 364. Inclined surface 152 directs a second flow substantially perpendicularly so as to pass through an exit 154 of fan module 100, as indicated by arrows 380 and 390 in FIG. 2. For example, in one embodiment, inclined surface directs a substantially vertically upward flow perpendicularly so as to exit fan module 100 substantially horizontally, as shown by arrows 380 and 390.

In one embodiment, baffle 112 has a plate 114 adjacent lower edge 103 and a plate 116 adjacent upper edge 101 interconnected by a plate 118, as shown in FIG. 2. In one embodiment, plate 118 slopes between plates 114 and 116 in a direction away from fans 108 and provides surfaces 150 and 152.

In one embodiment, a control circuit card 120 is disposed within a tray 122 located within frame 102, as shown in FIG. 1. In another embodiment, a cover 124 covers control circuit card 120, and cover 124 and control circuit card 120 are attached to tray 122 using fasteners 126, e.g., screws or the like. In other embodiments, cover 124 is a fire enclosure and is of a fire resistant material, such as metal or the like. An electrical connector 128 of control circuit card 120 passes through an opening 130 in tab 111 so that connector 128 protrudes from frame 102 in a direction away from sidewall 106. Control circuit card 120 also includes an electrical connector 132 that electrically interconnects control circuit card 120 and fans 108, e.g., via wires (not shown).

Control circuit card 120 receives power, e.g., from a battery or other power source, via electrical connector 128. Control circuit card 120 transmits the power to each of fans 108 via electrical connector 132. In some embodiments, control circuit card 120 monitors operation of fans 108 and transmits an alarm signal via electrical connector 128 when one of fans 108 fails.

A number of visual indicators 134, such as light emitting diodes, are disposed in frame 102 and are connected to control circuit card 120 by a connector 136. In one embodiment, visual indicators 134 pass through tab 107a, as shown in FIG. 1. Visual indicators 134 indicate the status of fans 108. For example, in some embodiments, one of visual indicators 134 lights when control circuit card 120 is receiving power, another lights when one or more of fans 108 fails, etc.

In one embodiment, a panel 136 having a plurality of perforations 137 is attached to frame 102 adjacent apertures 110. In another embodiment, a filter 138 is disposed adjacent to apertures 110 between panel 136 and sidewall 106. In other embodiments, apertures 140 pass through panel 136 and align with visual indicators 134. In another embodiment, visual indicators pass through apertures 140 and protrude from panel 136. In one embodiment, fasteners 142 of panel 136 thread into apertures 144 of tabs 107 to secure panel 136 to frame 102.

Figure 3:
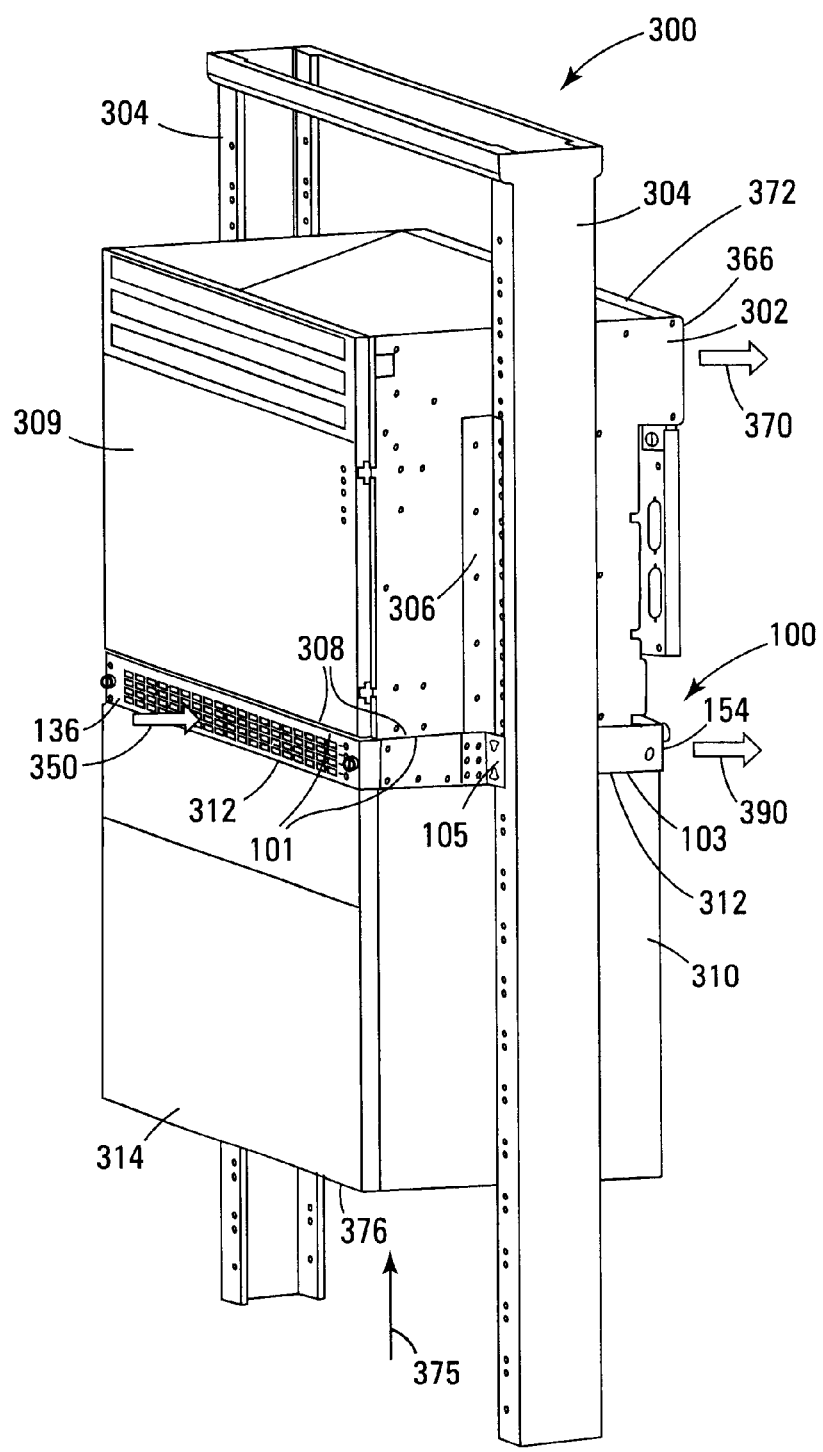
FIG. 3 is an isometric view of an electronics rack according to another embodiment of the present invention.

FIG. 3 illustrates an electronics rack 300 according to another embodiment of the present invention. Rack 300 includes successively adjacent chassis 302 and 310, each for containing electronic components, such as circuit cards. In one embodiment, chassis 302 and 310 contain telecommunications circuit cards, such as HDSL, HDSL2, T1 repeater, etc. Fan module 100 is disposed between chassis 302 and 310 so that edges 101 and 103 of fan module 100 respectively abut an edge 308 of chassis 302 and an edge 312 of chassis 310. In one embodiment, chassis 302 is located vertically above chassis 310, as shown in FIG. 3.

More specifically, chassis 302 is disposed between walls 304 of rack 300 and is secured to each of walls 304 by a bracket 306. Fan module 100 is also disposed between walls 304, and brackets 105 respectively attach fan module 100 to walls 304. In one embodiment, panel 136 is substantially flush with a front 309 of chassis 302, as shown in FIG. 3. Chassis 310 is disposed between walls 304, and in one embodiment, a bracket, such as bracket 306 for chassis 302, attaches chassis 310 to each of walls 304. In another embodiment, a front 314 of chassis 310 is substantially flush with panel 136 of fan module 100. In this embodiment, panel 136 and fronts 309 and 314 respectively of chassis 302 and 310 define a front of rack 300.

In one embodiment, fans 108 create an airflow into fan module 100 through perforations 137 substantially perpendicular to the front of rack 300, as shown by arrow 350 in FIG. 3. In another embodiment, the airflow passes through filter 138, as shown by arrow 355 in FIG. 1. The airflow passes through apertures 110 in sidewall 106, as indicated by arrow 360 in FIGS. 1 and 2. The airflow exits each of fans 108 through exits 109. Inclined surface 150 changes the direction of the airflow, as indicated by arrow 365 in FIG. 2, giving the airflow a component that is perpendicular, as shown by arrow 364, to the airflow (indicated by arrow 350) flowing into fan module 100. In one embodiment, the perpendicular component is substantially parallel to the front of rack 300. The airflow flows into chassis 302 for cooling the electronic components within chassis 302. In one embodiment, the air is directed so as to flow substantially perpendicularly to the front of rack 300 through an exit 366 of chassis 302, as indicated by arrow 370, in FIG. 3.

Figure 4:
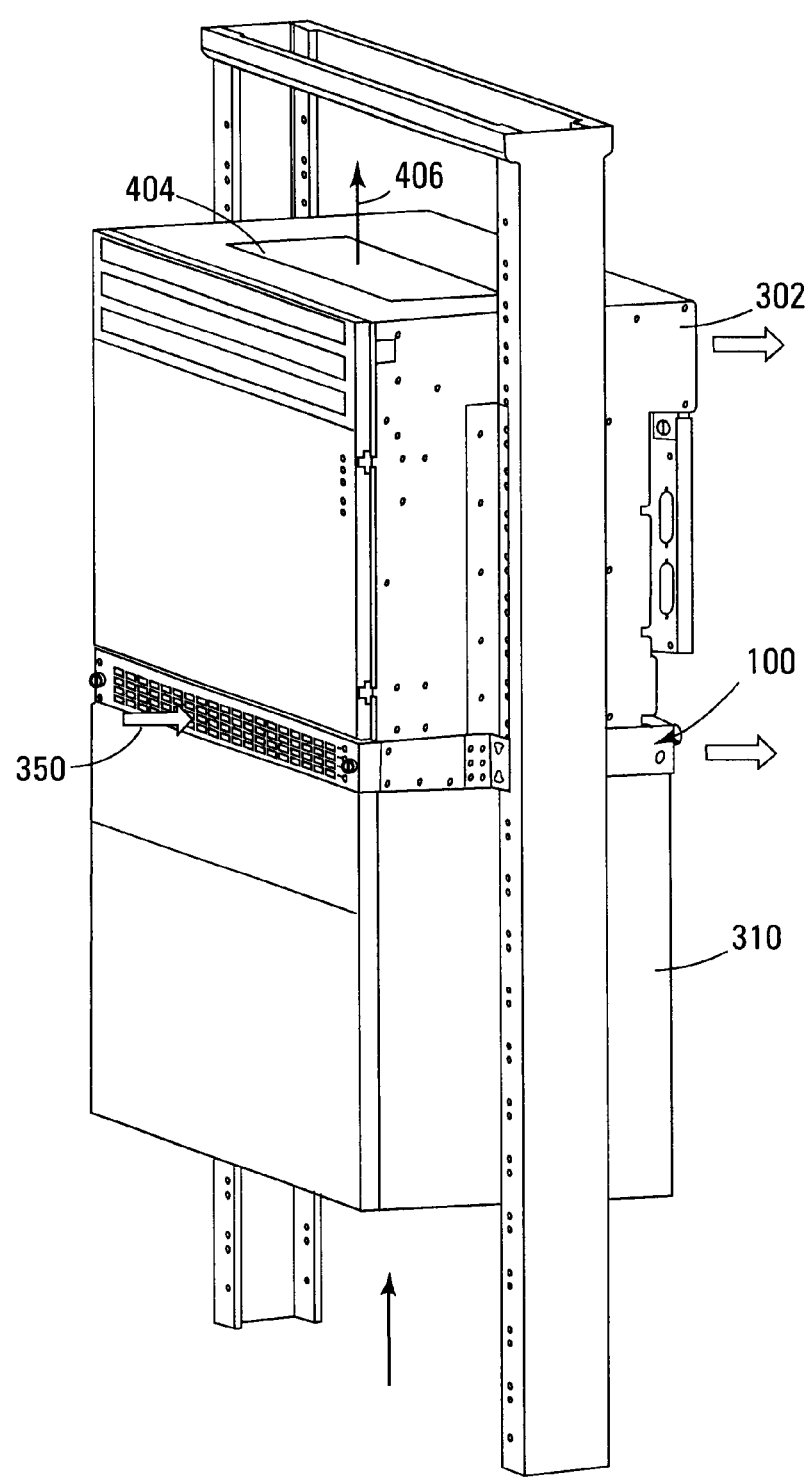
FIG. 4 is an isometric view of an electronics rack according to yet another embodiment of the present invention.

For embodiments where chassis 302 is located vertically above chassis 310, fans 108 draw air substantially horizontally into fan module 100 at the front of rack 300, as indicated by arrow 350 in FIGS. 1 and 3. Surface 150 directs the flow upwardly, as shown by arrow 365, into chassis 302. The flow removes heat from chassis 302 and exits chassis 302 substantially horizontally through exit 366 of chassis 302, e.g., at the back of rack 300, as shown by arrow 370. In one embodiment, a baffle 372 located atop chassis 302 directs the flow substantially horizontally through exit 366 of chassis 302. In another embodiment, the flow exits chassis 302 substantially vertically through a vent 404 atop chassis 302, as indicated by an arrow 406 in FIG. 4.

In other embodiments, a second airflow flows substantially parallel to the front of rack 300 and into chassis 310 for cooling the electronic components within chassis 310, as indicated by arrow 375. In some embodiments, the airflow is a natural convection flow, while in other embodiments, the airflow is created by fans (not shown). The air passes through chassis 310 toward chassis 302 and into fan module 100. The air is directed substantially perpendicularly by surface 152 of baffle 112, as indicated by arrow 380 in FIG. 2, so as to flow through an exit 154 of fan module 100, as shown by arrow 390 in FIGS. 2 and 3. This prevents air heated within chassis 310 from flowing into chassis 302.

For embodiments where chassis 302 is located vertically above chassis 310, the second airflow flows substantially vertically upward through a bottom 376 of chassis 310, as indicated by arrow 375. The airflow flows substantially upward through chassis 310 and into fan module 100. The air is directed substantially perpendicularly by a surface 152 of baffle 112, as indicated by arrow 380 in FIG. 2, so as to flow substantially horizontally through exit 154 of fan module 100, as shown by arrow 390 in FIGS. 2 and 3.

Figure 5:
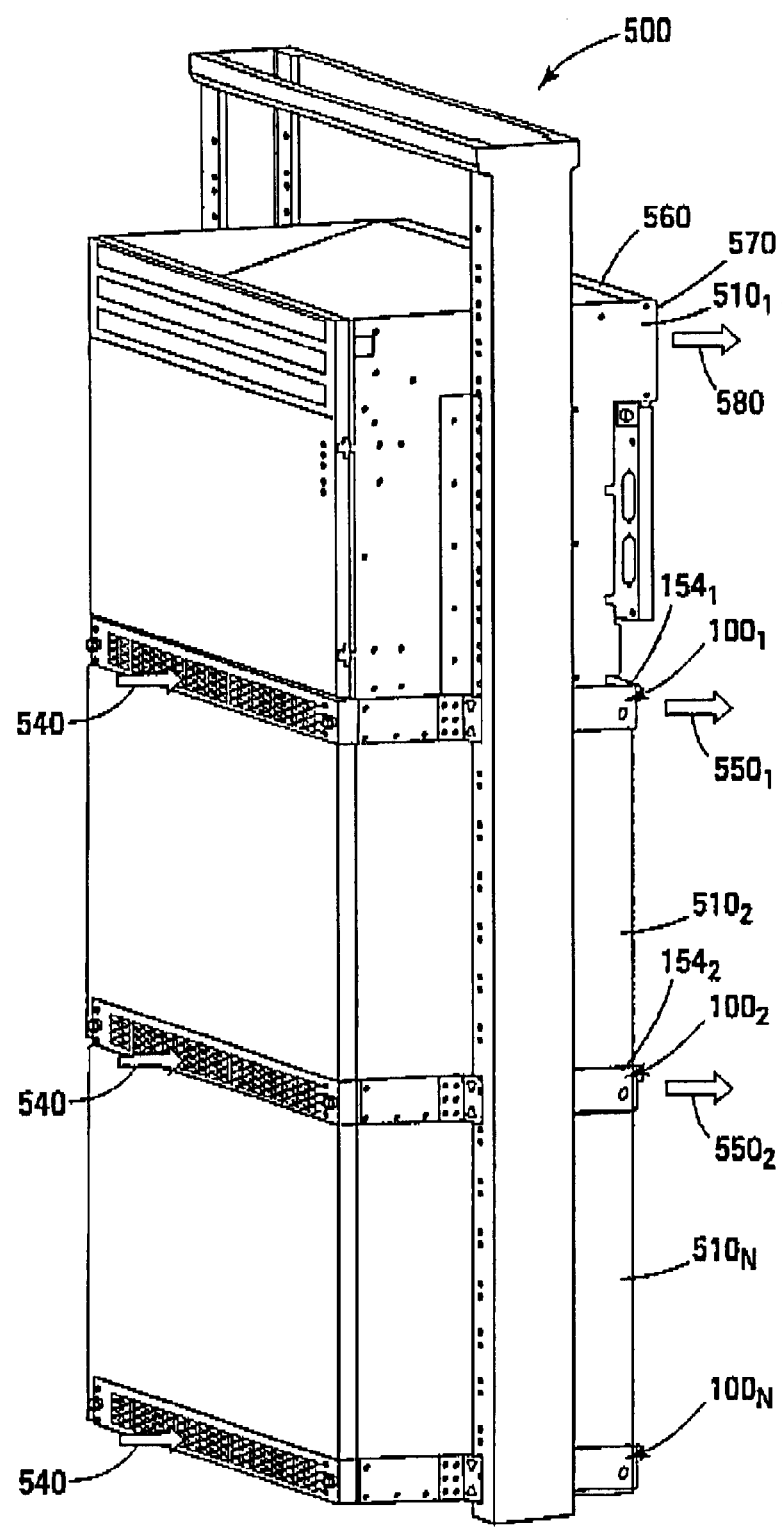
FIG. 5 is an isometric view of an electronics rack according to still another embodiment of the present invention.

FIG. 5 illustrates a rack 500 having chassis $510_1$ to $510_N$ stacked vertically one above the other. Fan module $100_1$ is disposed between chassis $510_1$ and $510_2$, and fan module $100_2$ is disposed between chassis $510_2$ and $510_N$. In one embodiment, fan module $100_N$ is located at the bottom of chassis $510_N$. Fan modules 100 draw air substantially horizontally through a front of rack 500, as indicated by arrows 540. Each of fan modules 100 directs the flow upwardly, as described above, into the chassis located above the respective fan modules 100. Air flowing through chassis $510_2$ and $510_N$ is respectively directed by fan modules $100_1$ and $100_2$, as described above, so as to flow substantially horizontally through exits $154_1$ and $154_2$ respectively of fan modules $100_1$ and $100_2$, as shown by arrows $550_1$ and $550_2$, at a back of rack 500. Air flowing through chassis $510_1$ is directed, in one embodiment, by a baffle 560 located atop chassis $510_1$ so as to flow substantially horizontally through an exit 570 of baffle 560, as indicated by arrow 580.

CONCLUSION

Embodiments of the present invention have been described. The embodiments provide fan modules that are adapted to be inserted between electronic component containing chassis that in one embodiment are stacked one above the other. The fan modules include a baffle having first and second inclined surfaces in opposition. In one embodiment, a fan of the fan module draws air substantially horizontally into the fan module to create a first airflow, and the first inclined surface directs the first airflow upwardly through a chassis located above the fan module for cooling that chassis. Drawing the air substantially horizontally overcomes the problems associated with locating fans on the bottom of the upper chassis between upper and lower chassis or between the upper chassis and a baffle located between the upper and lower chassis for forcing air substantially vertically upward through the upper chassis. The second inclined surface directs a second airflow, flowing substantially vertically through a chassis located below the fan module, substantially perpendicularly so as to exit the fan module substantially horizontally. This prevents the second airflow from flowing into the upper chassis, which is undesirable because the second airflow is heated by electronic components within the lower chassis as it flows through the lower chassis.

Although specific embodiments have been illustrated and described in this specification, it will be appreciated by those of ordinary skill in the art that any arrangement that is calculated to achieve the same purpose may be substituted for the specific embodiment shown. This application is intended to cover any adaptations or variations of the present invention. For example, the airflow passing through chassis 302 of FIG. 3 can exit chassis 302 substantially vertically through the top of chassis 302 instead of substantially horizontally as indicated by arrow 370. It is manifestly intended that this invention be limited only by the following claims and equivalents thereof.

What is claimed is:

1. A fan module comprising:
   a frame;
   at least one fan disposed within and attached to the frame so as to align with an aperture passing through the frame;
   a baffle disposed within the frame, the baffle having first and second inclined surfaces in opposition, the first surface for changing the direction of a first fluid flow from the at least one fan, the second surface for changing the direction of a second fluid flow so as to direct the second fluid flow through an exit of the fan module; and
   a controller disposed within the frame and electrically connected to the at least one fan.

2. The fan module of claim 1, wherein the controller supplies power to the at least one fan.

3. The fan module of claim 1, wherein the controller monitors operation of the at least one fan.

4. The fan module of claim 1, further comprising at least one visual indicator electrically connected to the controller and passing through the frame.

5. The fan module of claim 1, further comprising a panel attached to the frame adjacent the aperture, the panel having a plurality of perforations.

6. The fan module of claim 5, further comprising a visual indicator passing through the panel.

7. The fan module of claim 1, further comprising a filter disposed adjacent to the aperture.

8. The fan module of claim 1, wherein the at least one fan comprises a plurality of fans.

9. The fan module of claim 1, further comprising a pair of brackets attached to the frame for attaching the frame to a rack for containing chassis for containing electronic components.

10. A fan module comprising:
    a frame having opposing end walls and a sidewall connected between the end walls;
    at least one fan disposed within the frame and attached to the sidewall so as to align with an aperture passing through the sidewall;
    a baffle disposed between the end walls, the baffle having first and second inclined surfaces in opposition, the first surface for changing the direction of a first fluid flow from the at least one fan, the second surface for changing the direction of a second fluid flow so as to direct the second fluid flow through an exit of the fan module; and
    a controller disposed within the frame and electrically connected to the at least one fan.

11. The fan module of claim 10, further comprising a visual indicator electrically connected to the controller and passing through a tab connected substantially perpendicularly to one of the end walls.

12. The fan module of claim 10, wherein an electrical connector of the controller passes through a tab connected substantially perpendicularly to one of the end walls so as to protrude from the frame in a direction away from the sidewall.

13. The fan module of claim 10, wherein a bracket is attached to each of the end walls for attaching the frame to a rack for containing chassis for containing electronic components.

14. The fan module of claim 10, further comprising a panel attached to each of a pair of tabs respectively substantially perpendicularly connected to each of the end walls, the panel having a plurality of perforations.

15. The fan module of claim 14, further comprising a filter disposed between the sidewall and the panel.

16. The fan module of claim 14, further comprising a visual indicator passing through the panel.

17. A fan module comprising:
- a frame disposable between a first and second chassis contained within a rack, the frame attachable to the rack;
- at least one fan disposed within and attached to the Same so as to align with an aperture passing through the frame;
- a baffle disposed within the frame, the baffle having first and second inclined surfaces in opposition, the first surface for directing a first fluid flow from the at least one fan into the first chassis, the second surface for changing the direction of a second fluid flow from the second chassis so as to direct the second fluid flow through an exit of the fan module;
- a panel having a plurality of perforations attached to the Same adjacent the aperture;
- a controller disposed within the frame and electrically connected to the fan; and
- a visual indicator electrically connected to the controller and passing through the panel.

18. The fan module of claim 17, wherein the visual indicator is a light omitting diode.

19. The fan module of claim 17, further comprising a filter disposed adjacent the aperture.

20. An electronics rack comprising:
- a pair of walls;
- first and second chassis for containing electronic components disposed between the pair of walls, the first chassis located adjacent the second chassis;
- a modular fan unit disposed between the first and second chassis, the modular fan unit comprising:
  - a frame disposed between the pair of walls, the frame having a first edge abutting the first chassis and a second edge abutting the second chassis,
  - at least one fan disposed within the frame between the first and second edges so as to align with an aperture passing through the frame and so as to draw air into the rack substantially perpendicular to a front of the rack, and
  - a baffle disposed within the frame, the baffle having first and second inclined surfaces in opposition, the first surface for directing a first fluid flow from the at least one fan into the first chassis, the second surface for changing the direction of a second fluid flow from the second chassis so as to direct the second fluid flow to an exit of The fan module so that the fluid flow exits the fan module substantially perpendicular to front of the rack; and
  - a controller disposed within the frame and electrically connected to the at least one fan.

21. The electronics rack of claim 20, further comprising a panel attached to the frame adjacent the aperture, the panel having a plurality of perforations.

22. The electronics rack of claim 21, further comprising a visual indicator passing through the panel.

23. The electronics rack of claim 20, further comprising a filter disposed adjacent to the aperture.

24. A method for manufacturing a fan module, die method comprising:
- forming a fame;
- forming an aperture in the frame;
- attaching at least one fan to the frame so that the at least one fan aligns with the aperture in the frame;
- disposing a baffle within the frame, the baffle having first and second inclined surfaces in opposition, the first surface for changing the direction of a first fluid flow from the at least one fan, the second surface for changing the direction of a second fluid flow so as to direct the second fluid flow through an exit of the fan module; and
- electrically connecting a controller to the fan.

25. The method of claim 24, further comprising electrically connecting a visual indicator to the controller.

26. The method of claim 24, further comprising attaching a panel having a plurality of perforations to the frame.

27. The method of claim 24, further comprising disposing a filter adjacent the aperture.

28. A method for manufacturing a fan module, the method comprising:
- forming a frame;
- forming an aperture in the frame;
- attaching at least one fan to the frame so that tie fan aligns with the aperture in the frame;
- disposing a baffle within the frame, the baffle having first and second inclined surfaces in opposition, the first surface for changing the direction of a first fluid flow from the at least one fan, the second surface for changing the direction of a second fluid flow so as to direct the second fluid flow through an exit of the fan module;
- forming a tray within the frame;
- disposing a controller circuit card within the tray;
- electrically connecting the controller circuit card to the at least one fan; and
- electrically connecting a visual indicator to the controller circuit card.

29. The method of claim 28, further comprising attaching a panel having a plurality of perforations to the frame.

30. The method of claim 28, further comprising disposing a filter adjacent the aperture.

31. A method for cooling electronic component containing chassis located adjacent one another, the method comprising:
- inserting a fan module between first and second chassis located adjacent one another so that a first edge of the fan module abuts the first chassis and a second edge of fan the module abuts the second chassis;
- drawing air into the fan module to create a first airflow substantially perpendicular to fronts of the first and second chassis;

directing the first airflow into the first chassis using a first inclined surface of a baffle of the fan module to remove heat from the first chassis;

directing a second airflow through the second chassis toward the first chassis to remove heat from the second chassis;

directing the second airflow substantially perpendicularly so as to flow through an exit of the fan module using a second inclined surface of the baffle in opposition to the first surface to prevent the second flow from flowing into the first chassis; and electrically connecting a controller to the fan module.

32. The method of claim 31, further comprising filtering the first airflow.

33. The method of claim 31, further comprising directing the first airflow to flow from the first chassis in a direction substantially perpendicular to the front of the first chassis.

* * * * *